United States Patent [19]
Scheiber

[11] 3,959,590
[45] May 25, 1976

[54] STEREOPHONIC SOUND SYSTEM

[76] Inventor: Peter Scheiber, 1987 Crompond Rd., Peekskill, N.Y. 10566

[22] Filed: July 9, 1973

[21] Appl. No.: 377,723

Related U.S. Application Data

[63] Continuation-in-part of Ser. No. 697,103, Jan. 11, 1969, abandoned, Continuation-in-part of Ser. No. 270,184, July 10, 1972, and a continuation-in-part of Ser. No. 46,345, June 15, 1970, Pat. No. 3,746,792, which is a continuation-in-part of Ser. No. 888,440, Dec. 29, 1969, Pat. No. 3,632,886.

[52] U.S. Cl. ............................................. 179/1 GQ
[51] Int. Cl.² ............................................. H04R 5/00
[58] Field of Search ............ 179/1 G, 15 BT, 1 GQ, 179/100.4 ST

[56] References Cited
UNITED STATES PATENTS

| | | | |
|---|---|---|---|
| 2,098,561 | 11/1937 | Beers | 179/1 G |
| 3,082,381 | 3/1963 | Morrill et al. | 330/59 |
| 3,126,445 | 3/1964 | Golonske et al. | 179/1 G |
| 3,164,676 | 1/1965 | Brunner | 179/1 G |
| 3,184,550 | 5/1965 | Rogers | 179/1 G |
| 3,280,258 | 10/1966 | Curtis | 179/1 G |

*Primary Examiner*—Douglas W. Olms
*Attorney, Agent, or Firm*—Darby & Darby

[57] ABSTRACT

A stereophonic sound system where a plurality of audio signals produced at the program source are encoded to two channels for recording or transmission, and then decoded at playback to produce a plurality of acoustical signals corresponding to those received at the program source. The playback apparatus cooperates with a stereo signal source and includes a plurality of playback channels, the playback channels including gain controlled amplifiers adapted to be coupled to respective loudspeakers. Each of the gain controlled amplifiers is controlled by a control voltage generator that produces a control voltage, the magnitude of which is determined by specified loudness level, phase, and/or waveform characteristics of the signals in the playback channels.

17 Claims, 9 Drawing Figures

PETER SCHEIBER
INVENTOR.

BY Kenneth Glaser

ATTORNEY

FIGURE 4

| A & B RELATION | Φ=0°; L=MAX | Φ=0°; L=0 | Φ=180°; L=MAX | Φ=180°; L=0 |
|---|---|---|---|---|
| SOURCE POSITION | 3:00 OR 9:00 | 12:00 | 3:00 OR 9:00 | 6:00 |
| GAIN CHANNELS 1 & 2 | MAX | MIN | MAX | MIN |
| GAIN CHANNEL 3 | MIN | MAX | MIN | MIN |
| GAIN CHANNEL 4 | MIN | MIN | MIN | MAX |

| A & B RELATION | DISSIMILAR WAVEFORM; L=0 | DISSIMILAR WAVEFORMS; L=MAX |
|---|---|---|
| SOURCE POSITION | BOTH 1:00 AND 11:00 | BOTH 3:00 AND 9:00 |
| GAIN CHANNELS 1 & 2 | MAX | MAX |
| GAIN CHANNEL 3 | MIN | MIN |
| GAIN CHANNEL 4 | MIN | MIN |

FIGURE 5

PETER SCHEIBER
INVENTOR.

BY Kenneth Glaser
ATTORNEY

PETER SCHEIBER
INVENTOR.

BY Kenneth Glaser

ATTORNEY

STEREOPHONIC SOUND SYSTEM

This application is a continuation-in-part of prior co-pending application Ser. No. 697,103 filed Jan. 11, 1969 entitled STEREOPHONIC SOUND SYSTEM (now abandoned). The application is also a continuation-in-part of co-pending U.S. application Ser. No. 270,184 filed July 10, 1972 and a continuation-in-part of prior co-pending, application Ser. No. 46,345 filed June 15, 1970 now U.S. Pat. No. 3,746,792 which is, in turn, a continuation-in-part of application Ser. No. 888,440 filed Dec. 29, 1969, now U.S. Pat. No. 3,632,886.

This invention relates generally to improved stereophonic sound systems, and, more particularly, to a stereophonic sound system wherein three or more audio signals at the program source are encoded to two channels for recording or transmission, and then decoded at playback into three or more signals having a predetermined directional relationship to such audio signals.

Within the home and commercial entertainment field, extensive research and development has been conducted in the area of stereophonic sound reproduction for the purpose of providing a realistic recreation of sounds as they are present at the program source. Ideally, the loudspeakers of a stereophonic sound reproduction system should be so placed relative to the listener, and the sound emanating from each of these loudspeakers should so duplicate the sounds that reach a microphone similarly placed at the program source, that what actually is being heard by the listener as reproduced sound approaches the fullness, clarity, and aural dimension of the "live" sound at the program source.

Theoretically, this perfect reproduction of sound could be provided if one were to place an infinite number of microphones around the room at the program source, record or transmit the audio signals on an infinite signal source and then reproduce these signals by way of an infinite number of playback channels coupled to an infinite number of loudspeakers placed on a corresponding position as the microphones. This proposed system, however, is not compatible with existing broadcasting techniques, and is further limited by the absence of a commercially acceptable three or more channel phonograph pickup cartridge.

Various prior art systems have been devised, therefore, to simply improve the reproduction of sound of just the two recorded channels. Other systems have added the signals from the left and right channel to produce a third derived center channel, but the resultant sound emanating from the third speaker coupled to this derived channel does not realistically produce the sound which would be present at an additional, centrally placed microphone. In addition, the virtual sound source is restricted to the area between the right and left speakers.

In accordance with the above limitations of existing stereo reproduction systems, it is a primary object of the present invention to provide an improved stereophonic system capable of recreating live sound more realistically than has heretofore been obtainable.

It is another object of the invention to provide a stereophonic system where a plurality of program source audio signals encoded to two channels are reproduced at the playback portion to provide a plurality of decoded audio signals corresponding to the program source signals.

It is a further object of the invention to provide multiple channel reproduction apparatus wherein each of the loudspeakers associated with the respective playback channels is activated either independently or in combination with one another according to their position relative to the listener and the position of the microphones at the program source.

It is an even still further object of the invention to provide stereophonic reproduction apparatus which enables the placement of separately activated transducers or loudspeakers relative to the listener so that the virtual sound source can appear from any point on a 360° circle around the listener.

In accordance with these and other objects, the present invention is directed to a stereophonic sound system where audio signals generated at the program source and carried by three or more recording channels are initially encoded or converted into two channels for either broadcast or recording on conventional stereophonic media, and then decoded or reconverted to three or more channels at playback, the audio signal present in each of the playback channels corresponding essentially to the respective audio signal in each of the recording channels.

The playback or reproduction portion of the system includes three or more gain controllable amplifiers each of which receives one or both of the stereo signals in a preselected relationship. The transducers or loudspeakers are coupled to respective playback channels and are driven in accordance with a specified relationship between the two stereo signals. This specified relationship may be the ratio of intensity levels, difference in waveforms, and/or phase between the two source signals. These phase, waveform and loudness level cues, as they will be referred to, in the source signals, control the gain associated with each of the loudspeakers, thereby to independently activate the desired speaker and recreate the sounds as they were created at the program source.

In accordance with a preferred embodiment of the invention, control voltage generators provide an output based upon predetermined phase, waveform, and/or level cues, which output then controls the output of the gain controllable amplifiers in each playback channel. These control voltage generators may be designed with appropriate analog circuitry to produce the required output.

Various other features, objects, and advantages of the present invention will become more readily understood from the following detailed description taken in conjunction with the appended claims and attached drawings in which:

In the following description of the invention, the term "program source" refers to the source of the original sounds, as an orchestra or band; the term "signal source" refers to the playback portion and may be a stereophonic phonograph pickup, a stereophonic tape reproducer, or a stereophonic radio receiver, for example.

Figure 1:
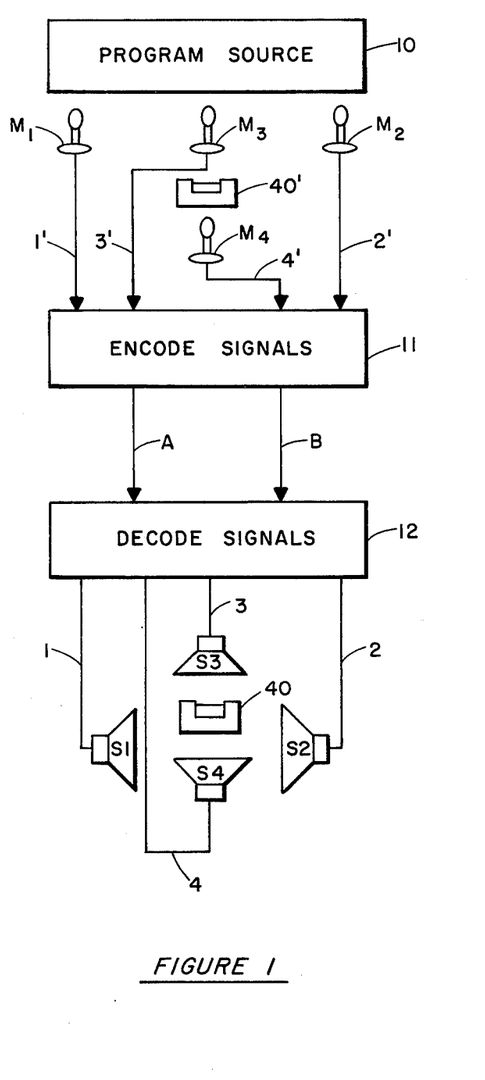
FIG. 1 is a block illustration of the entire sound system of the invention showing the record and playback portions.

Referring to FIG. 1, suitably spaced microphones $M_1$, $M_2$, $M_3$, and $M_4$ relative to a listener in seat 40' receive acoustical signals from the program source 10, and convert these signals to electrical audio signals (which may be referred to as $f_1, f_2, f_3$ and $f_4$) which are respectively carried by recording channels 1', 2', 3', and 4'. The audio signals $f_1 - f_4$ in the four recording channels then pass through encoding means 11 where the information on the four channels 1', 2', 3', and 4' is converted or encoded into two signals A and B. The signal A, for example, may include the audio signal $f_1$ in channel 1', the signal B may include the audio signal $f_2$ in channel 2', and both signals A and B may include the information received from channels 3' and 4', i.e. $f_3$ and $f_4$.

At the playback or reproduction portion of the system, a decoder 12 decodes the two signals A and B into four (for example) output audio signals $g_1, g_2, g_3$ and $g_4$. Signals $g_1 - g_4$ are fed through playback channels 1, 2, 3, and 4 to respective loudspeakers $S_1, S_2, S_3$, and $S_4$ arranged relative to a listener in seat 40 as illustrated. As subsequently described, each of the loudspeakers are driven according to a specified relationship between the signals A and B to allow the production of sound from these speakers corresponding essentially to the sound received by the corresponding microphone at the program source.

The above-mentioned application Ser. No. 46,345 sets forth generalized encoding and decoding mathematical formulas for transmitting three or more directional sound signals on only two audio information transmission paths. The general encoding formulas for the A and B signals (i.e., the two stereo signals to be transmitted) are as follows:

$$A = f_1 \sin(x_1/2) + f_2 \sin(x_2/2) \ldots + f_n \sin(x_n/2) \text{ and}$$

$$B = f_1 \cos(x_1/2) + f_2 \cos(x_2/2) \ldots + f_n \cos(x_n/2),$$

where $f_n$ is any audio signal and $x_n$ represents the angular direction of said audio signal as measured from a reference direction (for convenience assigned to the A or B channel) i.e., the direction of a signal appearing in that channel alone.

The general decoding formula for any decoder output $g_n$ is:

$$g_n = A \sin(x_n/2) + B \cos(x_n/2)$$

In U.S. Pat. No. 3,632,886 there is disclosed a specific case of these general mathematical equations with the transmitted audio signals A and B being defined as:

$$A = L + .707F + .707X \text{ and}$$

$$B = R + .707F - .707X$$

where $f_1 = L$ at $x = 180°$; $f_2 = F$ at $x = 90°$; $f_3 = R$ at $x = 0°$; and $f_4 = X$ at $x = 270°$.

The decoding equations in this case are $g_1 = A$      $(x = 180°)$
$g_2 = .707(A+B)$      $(x = 90°)$
$g_3 = .707(A-B)$      $(x = 270°)$ and
$g_4 = B$      $(x = 0°)$.

As described in the aforementioned Scheiber applications and patents, there is a virtually limitless number of ways in which signals may be encoded for transmitting fully directional information on only two transmission paths A and B.

Figure 2:
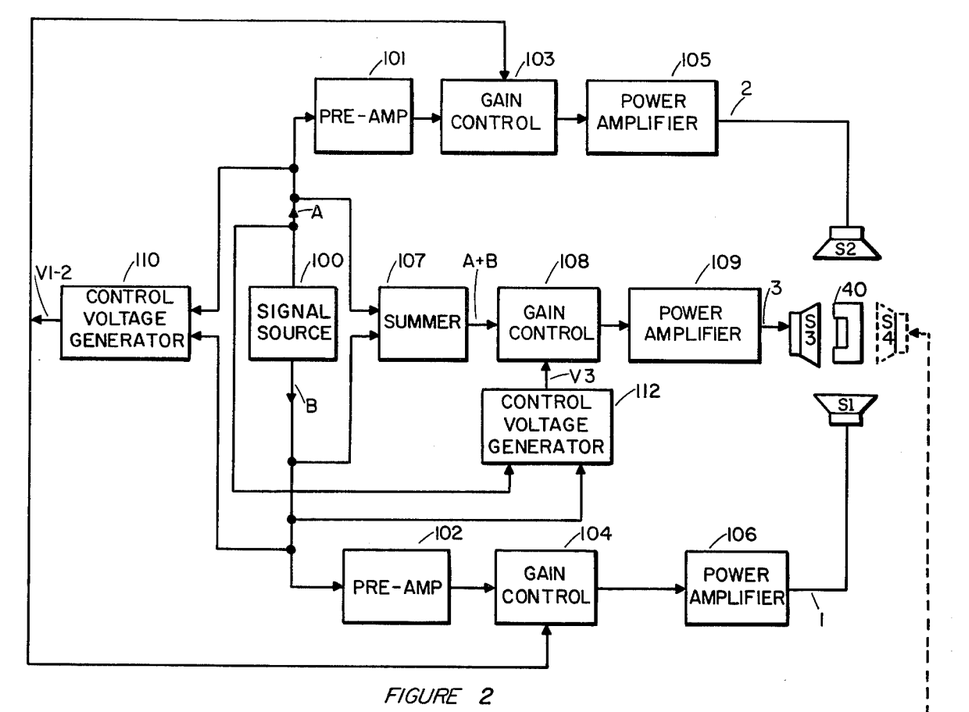
FIG. 2 is a block diagram schematic of one embodiment of the playback or reproduction apparatus, illustrating three playback channels coupled to a two channel stereo signal source.

The present invention does not require the use of matrixing but pertains instead to a method of controlling the gain of the dematrixed signals to transmit directional information. Since parent application Ser. No. 697,103 was originally filed, commercial exploitation of two channel quadraphonic sound systems has progressed from matrix only systems to matrix systems with directionality enhanced by gain control. It therefore will be expected as a practical matter that the A and B signals shown in FIG. 1 will have been encoded in accordance with matrix techniques more fully described in the above noted Scheiber applications. In FIG. 2, the signal source 100 produces these encoded A and B signals from a two-channel record (or other source).

The playback or reproduction apparatus of the stereo sound system of the invention couples the A and B signals to three or more speakers, each of which may be considered to correspond to a microphone at the program source. FIG. 2 illustrates the three channel embodiment of the present invention which includes a pair of transducers or loudspeakers $S_1$ and $S_2$ respectively connected with the playback channels 1 and 2, and a third transducer or loudspeaker $S_3$, sound emanating from the loudspeakers $S_1$ and $S_2$ directed toward the left and right ears of the listener respectively.

A stereo signal source 100 furnishes a signal A to a preamplifier 101 in the right channel 2, and a signal B to a preamplifier 102 in the left channel 1. These stereo signals A and B contain the audio information of channels 1' − 3' which have previously been encoded, as described above.

The output of preamplifier 101 is coupled to a gain control stage 103, the output of the gain control being coupled to the input of a power amplifier 105 which is coupled with the transducer $S_2$, the speaker $S_2$ converting the audio signals in playback channel 2 to corresponding acoustical signals. Similarly, the output of the preamplifier 102 is coupled with the gain control 104 which is coupled to a power amplifier 106, the output of which is connected to the transducer $S_1$ of channel 1.

A center playback channel 3 is provided by feeding a portion of the signals A and B to a summer 107, the resulting summed signal (A + B) passing through a gain control circuit 108, a power amplifier 109 and thereafter to the loudspeaker $S_3$. Preamplifiers appropriately placed may also be utilized in a conventional manner. The loudspeaker $S_3$ corresponds, for example, to the centrally positioned microphone $M_3$ at the program source, and produces the sound which this microphone has received.

Since the objective is to authentically recreate the sounds heard by a listener in the chair 40 as they would be heard at the program source, each of the speakers should be activated at the time and to the extent necessary to achieve this objective. Thus, where the loudspeakers $S_1 - S_3$ are positioned with respect to the listener as illustrated, no sound should emanate from the outer speakers $S_1$ and $S_2$ when the sound at the program source has originated at center stage. On the other hand, when the sound has originated near one of the right or left pickup microphones $M_2$ or $M_1$, the sound emanating from either the loudspeaker $S_2$ or $S_1$ should be at a maximum. Similarly, when the sound has originated at center stage at microphone $M_3$, or when the sounds originating directly in front of the right and left pickup microphones are of equal phase, intensity, and waveform, the sound emanating from the loudspeaker $S_3$ should be at a maximum, and should be at a minimum when sound originated solely in front of one of the pickup microphones $M_1$ or $M_2$.

Figure 4:
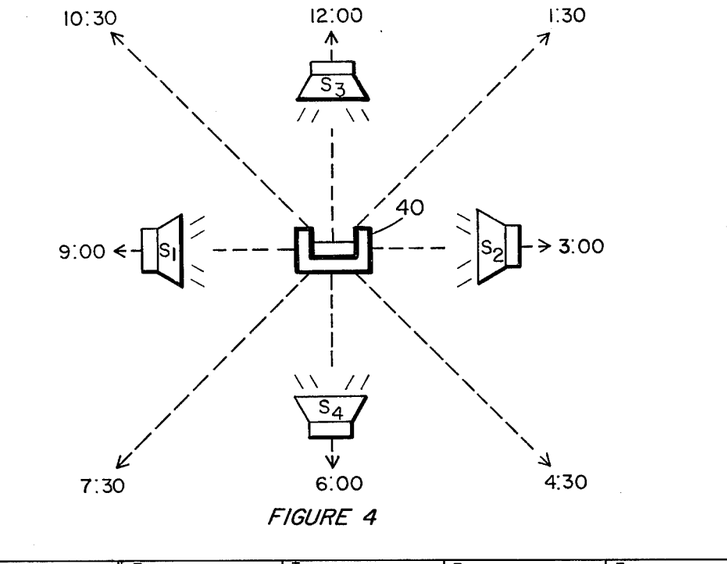
FIGS. 4 and 5 are a diagram and accompanying chart illustrating one example of the spacing of loudspeakers and the desired gain associated with each loudspeaker in relation to specific level, waveform, and phase conditions.

To accomplish these objectives, the gain associated with each of the speakers in the respective channels is controlled in response to the phase, waveform, and/or intensity level ratio relationship between the source signals A and B (source signal cues). Referring now to the diagram of FIG. 4 and the table of FIG. 5, there is summarized the sound source positions corresponding to the various combinations of phase differences Φ, loudness level differences L, and dissimilarities in waveforms of signals A and B. The term "L" is defined as the difference in loudness level expressed in decibels. There is also charted the required degree of gain associated with each playback channel to accomplish the desired authentic recreation of the original acoustical signals. For example, when the loudness level, and the phase and waveform of both the signals A and B are substantially identical (this would occur when the sound originated at center stage and/or sounds of equal level, phase and waveform originated in front of the right and left pickup microphones), the sound source to a listener sitting at the center of the auditorium at the program source (or to a listener seated in the seat 40) is at the 12:00 o'clock position. Thus the gain associated with the speaker of channel 3 should be at a maximum.

Figure 5:
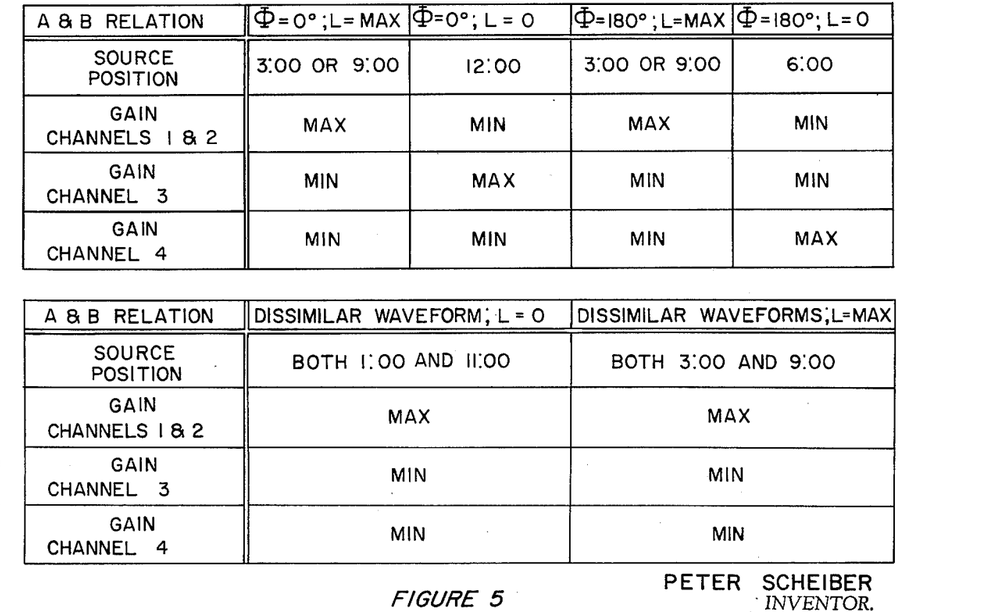

On the other hand, when the phase difference Φ is zero and the loudness level difference L is at its maximum (this would occur when the sound originated at either one or the other of the two pickup microphones $M_1$ or $M_2$), the sound source position would be either at 3:00 o'clock or 9:00 o'clock depending upon in which of the two channels 1 or 2 the signal was present. Thus, the gain associated with either speaker $S_1$ or $S_2$ should be maximum while the gain associated with $S_3$ should be minimum. Additionally, regardless of the value of the loudness level difference L, whenever there is a dissimilarity in waveforms between signals A and B, the gains associated with both playback channels 1 and 2 are at a maximum, and is a minimum for center channel 3. This permits the reproduction of acoustical signals from loudspeakers $S_1$ and $S_2$ but not from loudspeaker $S_3$ when the audio signals are of different waveform but equal level.

The chart of FIG. 5 depicts only the extreme situations, the position of the sound source of course moving from the 12:00 o'clock position to either the 3:00 o'clock or 9:00 o'clock position as the intensity level ratio (loudness level) increases from zero to maximum for identical phase. Thus, for example, as the intensity level increases at the right pickup microphone $M_1$ with respect to the left pickup microphone $M_2$, the source position would move from the 12:00 o'clock position to the 3:00 o'clock position, the source position being at 1:30 when the gain associated with the speakers 1 and 3 were approximately equal.

Figure 3:
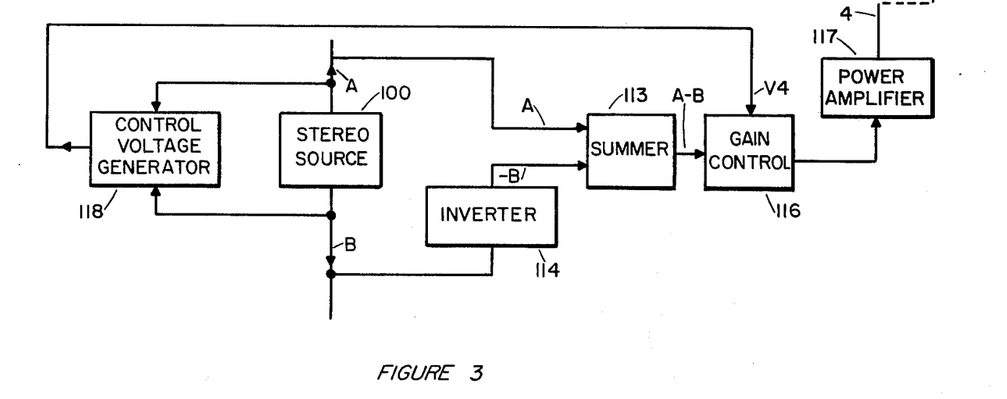
FIG. 3 is a block diagram schematic illustrating the addition of a fourth playback channel to the embodiment of FIG. 2.

As a further embodiment encompassing the principles of the present invention, a fourth speaker $S_4$ may be located behind the listener (as illustrated by the dotted outline of FIG. 2) to recreate sound that would come from behind a listener at the program source at a microphone $M_4$. Accordingly, this speaker receives the algebraic difference (A − B) of the signals A and B and is gain controlled to have maximum output when the signals A and B are of equal loudness level (L = O) and are 180° out of phase. Accordingly, a fourth playback channel 4 is provided by feeding a portion of the signals A and B from the source 100 to the input of a summer 113 after the signal B has been inverted at 114, the resulting signal (A − B) passing through the gain control 116, the output of which is coupled to the power amplifier 117. While not shown, preamplifiers may be inserted at appropriate locations after the stereo source 100.

In summary, the gain associated with the speakers of playback channels 1 and 2 increases as the ratio of intensity levels between the signals A and B varies from unity; or as the waveforms of A and B become increasingly dissimilar. The gain associated with the speakers of channel 3, on the other hand, increases as the level ratio between signals A and B approaches unity, when their waveforms are approximately indentical and in phase. The gain associated with speaker $S_4$ in playback channel 4 increases as the level ratio between signals A and B approaches unity when the waveforms are approximately identical and 180° out of phase.

It is to be pointed out that additional channels may be coupled to the stereo signal source, their respective gains being determined by other defined relationships in the signals A and B. Thus, a fifth or sixth channel may be added, for example, the gain associated with channels 1 and 2 increasing responsive to dissimilar waveforms and unequal loudness levels of signals A and B; the gain associated with channels 5 and 6 increasing with similar waveforms and unequal levels. The loudspeakers in these channels may be added at any point around the listener, thereby enabling the location of the virtual sound source at additional points around a 360° circle, or even in another plane perpendicular to that of the four channels.

As a specific feature of the invention, the gain associated with each speaker is determined by a combination of a gain control element serially connected in the respective channel, and a control voltage generator whose output is coupled to the gain control element. The audio signal in each playback channel (A, B, A + B, or A − B) passes through the respective gain control element. Then, according to the output signal of the control voltage generator, the signal in the gain control element is either enhanced or de-emphasized. When the output signal of the control voltage generator is at a maximum, the output of the gain control element is at a maximum, and vice-versa.

The gain control elements 103 and 104 are thus controlled by an output voltage $V_{1-2}$ produced by the control voltage generator 110. The gain control element 108 is controlled by an output voltage $V_3$ produced by the control voltage generator 112, and the gain control element 116 is controlled by an output voltage $V_4$ produced by the control voltage generator 118. If desired, separate control voltage generators may be respectively coupled to gain control elements 103 and 104 rather than just one (generator 110).

The expressions for each of the control voltages $V_{1-2}$, $V_3$, and $V_4$ are dictated by design considerations of the various control voltage generators which produce these expressions, as well as by the specific phase, waveform, and level cues present in the original signals A and B which are to activate the respective speakers, as specified in FIG. 5.

For example, the desired acoustical reproduction, as outlined in FIG. 5, requires that the gain associated with the speakers of channels 1 and 2 increases as the ratio of the intensity levels of the signals A and B diverges from unity, or their waveforms become increasingly dissimilar. To achieve this result, the control voltage $V_{1-2}$ applied to the gain control elements 103 and 104 may be represented by one of various expressions. Among these are $$V_{1-2} = k \left| \frac{A-B}{A+B} \right|; V_{1-2} = k \left| \frac{A-B}{A+B} \right|;$$

$$V_{1-2} = k \left| \log \frac{A}{B} \right|.$$

In accordance with a preferred embodiment, however, the control voltage generator 110 comprises analog circuitry which furnishes a control voltage $$V_{1-2} = \left| \log \frac{A}{B} \right| + \left| \log - \frac{A}{B} \right| - k \left| \log \frac{envA}{envB} \right| - V_{SAT}.$$

where the term "env" indicates the instantaneous value of the intensity of the envelope voltage, independent of phase and polarity, obtained by full wave rectification and smoothing of the particular signal A or B. This control voltage $V_{1-2}$ then increases as the loudness level associated with either the A or B signals becomes stronger with respect to the other, or their waveforms become increasingly dissimilar. A constant voltage $V_{SAT}$ assures a positive value for the control voltage.

The gain in channel 3, on the other hand, is to increase as the ratio of the intensity levels of each of the signals A and B approaches unity (L = O), and as their waveforms become similar and in phase. Accordingly, the expression for the control voltage produced by the control voltage generator 112 may be $$V_3 = V_{SAT} - \left| \log \frac{A}{B} \right|.$$

The gain associated with channel 4 is to be activated increasingly as the intensity level ratio of the signals approaches unity (L = O), and as their waveforms become similar and 180° out of phase. Accordingly, the control voltage generator 113 may provide an output expression $$V_4 = V_{SAT} - \left| \log \frac{-A}{B} \right|.$$

Figure 6:
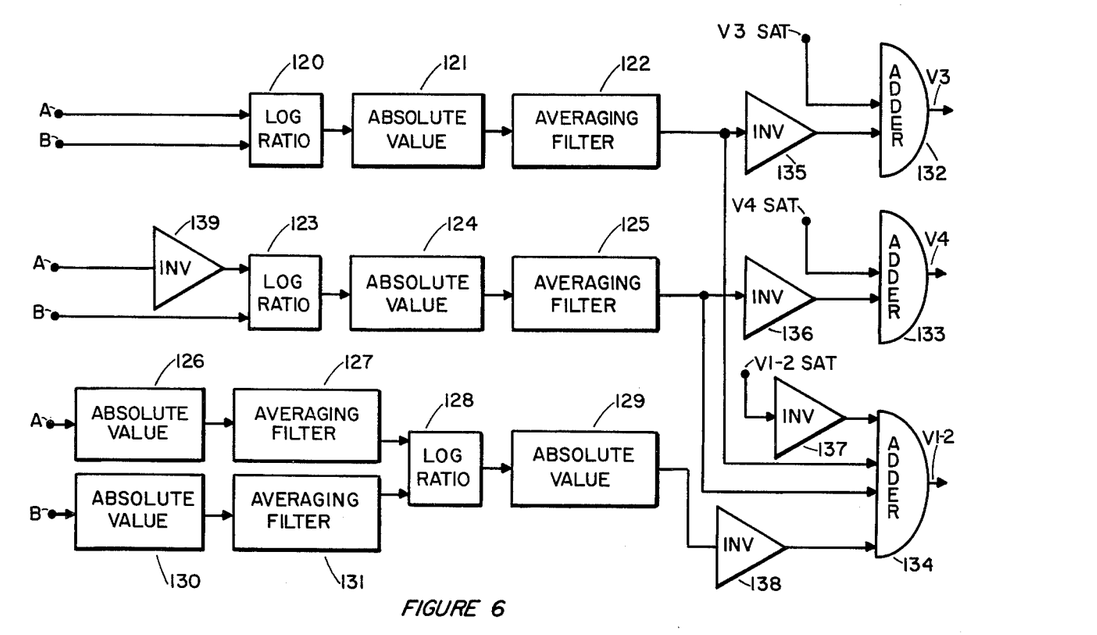
FIG. 6 is a block diagram schematic of the control voltage generators shown in FIGS. 2 and 3.
Figure 8:
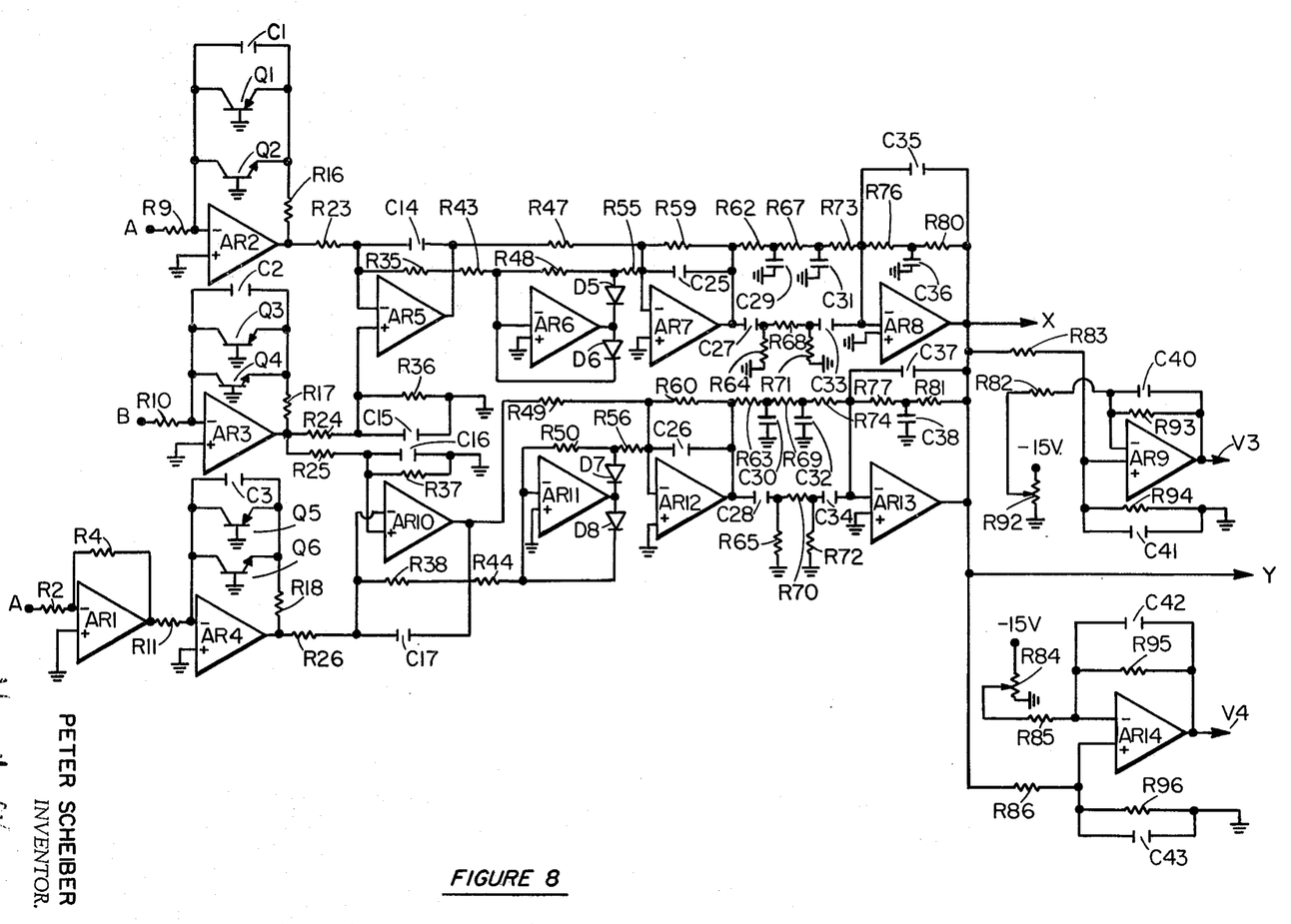
FIGS. 8 and 9 are detailed schematic circuit diagrams of the control voltage generators illustrated in the block diagram of FIG. 6.
Figure 9:
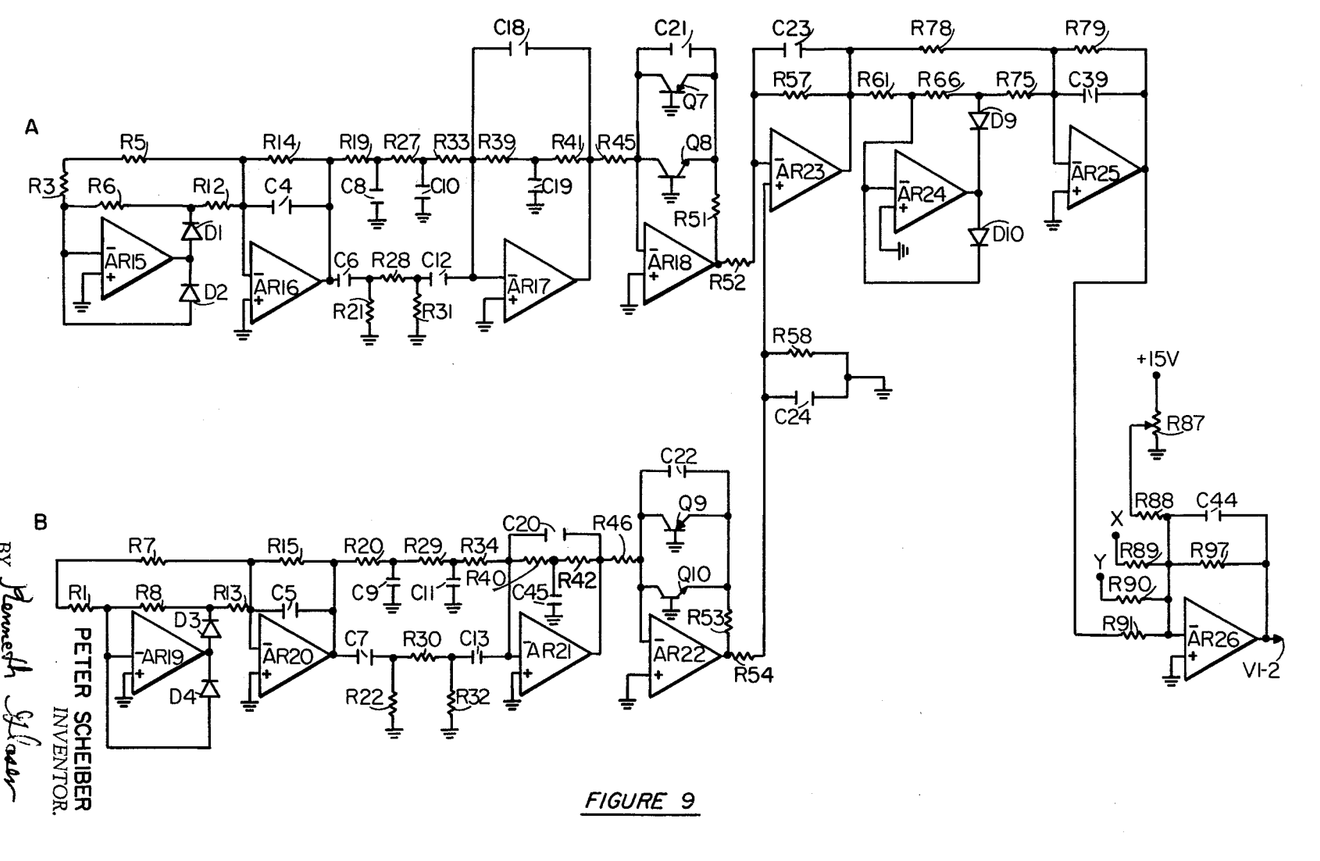

The construction of the control voltage generators 110, 112, and 118 is based upon analog circuits providing these control voltages, $V_{1-2}$, $V_3$, respectively. For example, in order to sense loudness level differences, circuit means for obtaining the log ratio of the intensity levels of the signals A and B are required. These circuits may be incorporated into a single structure as depicted in FIGS. 6, 8, and 9. Accordingly, the signals A and B are fed into the log ratio unit 120, the output of log ratio unit 120 being coupled to the absolute value unit 121, its output being coupled to the averaging filter unit 122. The output of the averaging filter is then directed through an inverter 135, whose output along with the voltage $V_{3\ SAT}$ is applied to the input of the adder 132. The output voltage $$V_3 = V_{SAT} - \left| \log \frac{A}{B} \right|$$

is then applied to one input terminal of the gain control element 108 in channel 3.

Similarly, the control voltage $V_4$ is provided by applying the signal voltage B and the inverted signal voltage A (the output of the inverter 139) to the log ratio means 123. The output of the means 123 is coupled to the absolute value means 124, which output is coupled to the averaging filter 125. The output signal of the filter 125 is applied to the input of the inverter 136, the resulting inverted output being applied along with the constant voltage $V_{4\ SAT}$ to the adder 133. The output voltage $$V_4 = V_{SAT} - \left| \log \frac{-A}{B} \right|$$

is then applied to one input terminal of the gain control element 116 in channel 4.

The control voltage generator 110 comprises the absolute value circuit means 126 and 130, averaging filters 127 and 131, log ratio means 128, absolute value means 129, inverters 137 and 138, and adder 134. As observed, the output of the filters 122 and 125 are respectively coupled along with the outputs of the inverters 133 and 137 to the input of the adder 134. The output voltage $$\left( V_{1-2} = \left| \log \frac{A}{B} \right| + \left| \log - \frac{A}{B} \right| - k \left| \log \frac{envA}{envB} \right| - V_{SAT} \right)$$

is then applied to an input terminal of the gain control elements 103 and 104, as shown in FIG. 2.

The specific circuitry constituting the various blocks of FIG. 6 is illustrated in FIGS. 8 and 9. Accordingly, the log ratio means 120 and 123 comprise operational amplifiers $AR_2$, $AR_3$, $AR_4$, $AR_5$, and $AR_{10}$, transistors $Q_1 - Q_6$, capacitors $C_1 - C_3$ and $C_{14} - C_{17}$, and resistors $R_9 - R_{11}$, $R_{16} - R_{18}$, $R_{23} - R_{26}$, and $R_{35} - R_{38}$. The absolute value means 121 and 124 comprise operational amplifiers $AR_6$, $AR_7$, $AR_{11}$, and $AR_{12}$, diodes $D_5 - D_8$, resistors $R_{43}$, $R_{44}$, $R_{47} - R_{50}$, $R_{55}$, $R_{56}$, $R_{59}$, and $R_{60}$, and capacitors $C_{25}$ and $C_{26}$.

The averaging filters 122 and 125 comprise operational amplifiers $AR_8$ and $AR_{13}$, capacitors $C_{27} - C_{38}$, and resistors $R_{62} - R_{65}$, $R_{67} - R_{74}$, $R_{76}$, and $R_{77}$. The inverters 135 and 136 shown in block form in FIG. 6 are unnecessary when negative voltages are utilized for $V_{3\ SAT}$ and $V_{4\ SAT}$ applied through resistors $R_{82}$ and $R_{85}$ to the negative terminals of the amplifiers $AR_5$ and $AR_{14}$, as illustrated in FIG. 8.

The inverter 139 comprises operational amplifier $AR_1$, and resistors $R_2$ and $R_4$. The adder 132 comprises operational amplifier $AR_9$, resistors $R_{93}$, and $R_{94}$, and capacitors $C_{40}$ and $C_{41}$. The adder 133 comprises operational amplifier $AR_{14}$, capacitors $C_{42}$ and $C_{43}$, and resistors $R_{95}$ and $R_{96}$.

As illustrated by FIG. 9, the absolute value means 126 comprises operational amplifiers $AR_{15}$ and $AR_{16}$, resistors $R_3$, $R_5$, $R_6$, $R_{12}$, and $R_{14}$, diodes $D_1$ and $D_2$, and capacitor $C_4$. Absolute value means 130 comprises $AR_{19}$ and $AR_{20}$, resistors $R_1$, $R_7$, $R_8$, $R_{13}$, and $R_{15}$, diodes $D_3$ and $D_4$, and capacitor $D_5$.

Averaging filter 127 comprises operational amplifier $AR_{17}$, resistors $R_{19}$, $R_{27}$, $R_{33}$, $R_{39}$, $R_{41}$, $R_{28}$, $R_{21}$, and $R_{30}$, and capacitors $C_6$, $C_8$, $C_{10}$, $C_{12}$, $C_{18}$, and $C_{19}$. Averaging filter 131 comprises operational amplifier $AR_{21}$, resistors $R_{20}$, $R_{29}$, $R_{34}$, $R_{40}$, $R_{42}$, $R_{22}$, $R_{30}$, and $R_{32}$, and capacitors $C_7$, $C_9$, $C_{11}$, $C_{13}$, $C_{20}$, and $C_{45}$.

Log ratio means 128 comprises operational amplifier $AR_{18}$, $AR_{22}$, $AR_{23}$, transistors $Q_7 - Q_{10}$, resistors $R_{45}$ and $R_{46}$, $R_{51} - R_{54}$, $R_{57}$, and $R_{58}$, and capacitors $C_{21} - C_{24}$. Absolute value means 129 comprises operational amplifiers $AR_{24}$ and $AR_{25}$, resistors $R_{61}$, $R_{66}$, $R_{75}$, $R_{78}$, and $R_{79}$, and diodes $D_9$ and $D_{10}$. Adder 134 comprises operational amplifier $AR_{26}$, resistors $R_{88} - R_{91}$, $R_{97}$, and capacitor $C_{44}$.

It is to be noted from FIG. 8 that the outputs of the operational amplifiers $AR_8$ and $AR_{13}$ are actually negative, and are applied to the positive terminals of the adder amplifier $AR_9$ and $AR_{14}$. This fact, plus the fact that negative supply voltages (−15 volts) are utilized for $V_{SAT}$, enables the omission of the inverters 135 and 136. In like manner, the use of a positive supply voltage for $V_{SAT}$ (FIG. 9) applied to the negative input of amplifier $AR_{26}$, and the application of the positive voltage of the output of the amplifier $AR_{25}$ obviates the need for inverters 137 and 138. Negative outputs at the X and Y terminals shown in FIG. 8 are then applied to the negative input terminal of amplifier $AR_{26}$ as shown in FIG. 9.

Neither the expressions for $V_{1-2}$, $V_3$, or $V_4$ nor the specific circuitry illustrated in FIGS. 6, 8, and 9 for providing these functions is critical to the present invention. Accordingly various other circuitry providing the desired result may be utilized to control the gain of the respective speakers. Even if the control voltage generators are employed in conjunction with the gain control elements to provide this gain control function, a different spatial arrangement of the speakers, a different number of channels, or more economy may dictate entirely different circuitry for the generators.

Figure 7:
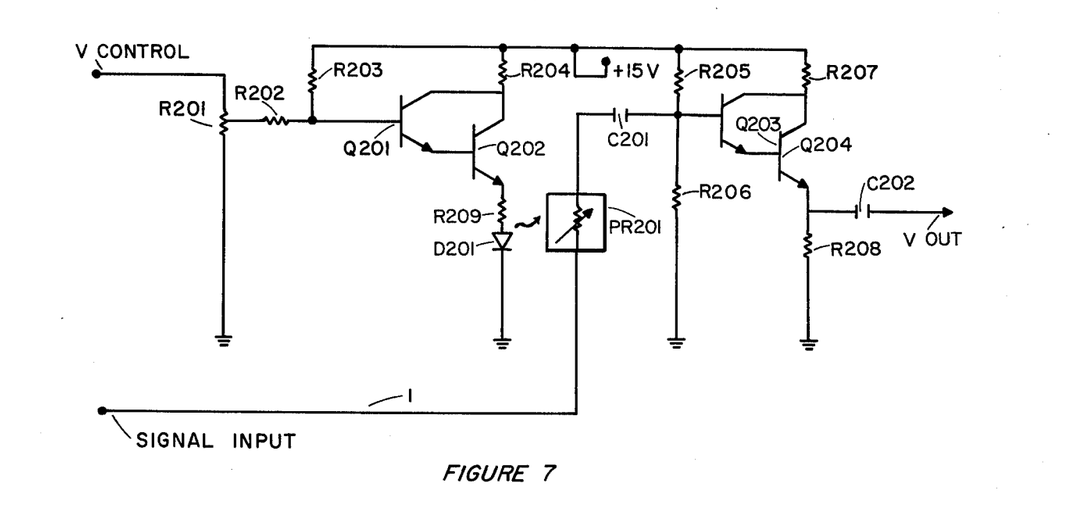
FIG. 7 is a circuit schematic of the gain control elements which constitute a specific feature of the invention.

As a specific feature of the present invention, each of the gain control elements 103, 104, 108, and 116 comprise circuitry as illustrated in FIG. 7. The heart of the circuitry includes a semiconductor diode light source $D_{201}$ and a photoresponsive resistor $PR_{201}$. The light emitting diode $D_{201}$ may be of gallium arsenide, for example.

As the current through the diode $D_{201}$ increases, an increasing amount of light is thereby emitted which reaches the photoresistor $PR_{201}$. This results in a corresponding decrease in the resistance of the photoresistor, and current flowing through the photoresistor $PR_{201}$ is thereby enhanced. Any decrease in current through the light emitting diode then similarly results in a decrease of current flowing through the resistor $PR_{201}$.

Accordingly, current representing the audio signal, for example the signal in channel 1, passes through the photoresistor $PR_{201}$ and thereon through the emitter follower amplifier arrangement including $Q_{203}$ and $Q_{204}$. The control voltage, $V_{1-2}$ for example, is applied to the other input terminal. As $V_{1-2}$ increases in response to the various level, waveform, and/or phase cues, as described above, this causes the corresponding enhancement of the signal current through the photoresistor, and consequently the enhancement of the output voltage $V_{OUT}$. This increased voltage $V_{OUT}$ thus increases the gain associated with the loudspeaker in that channel, in this instance loudspeaker $S_1$. As the control voltage $V_{1-2}$ decreases, the opposite effect occurs. In like manner the gain of the other transducers may be controlled.

Although not illustrated in the drawing, it may be desirable to add a series resistor and capacitor (RC circuit) in parallel with the photoresistor $PR_{201}$ so that both gain and frequency response may be simultaneously controlled. Thus, the frequency response may be narrowed for low levels of current, and turntable rumble and 60 cycle noise may be eliminated at these low levels.

The circuits described with reference to FIGS. 7, 8, and 9 may be constructed using conventional circuit components having desired values. The circuits may be conventional discrete components or may utilize integrated circuits of monolithic or hybrid construction. As an example, however, of typical component values, the circuits illustrated in these FIGS. were constructed employing components having the following values:

| OPERATIONAL AMPLIFIERS | |
|---|---|
| $AR_1$, $AR_5-AR_{17}$, $AR_{18}-AR_{21}$, | P85AU (Philbrick-Nexus) |
| $AR_{23}-AR_{26}$ | |
| $AR2-AR_4$, $AR_{18}$, $AR_{22}$ | P25AU |
| TRANSISTORS | |
| $Q_1$, $Q_3$, $Q_5$, $Q_7$, $Q_9$, | ½-PL1/P (Philbrick-Nexus) |
| $Q_2$, $Q_4$, $Q_6$, $Q_8$, $Q_{10}$ | ½-PL1/N |
| $Q_{201}$, $Q_{203}$ | 2N3707 |
| $Q_{202}$, $Q_{204}$ | 2N3704 |
| DIODES | |
| $D_1-D_{10}$ | 1N914 |
| $D_{201}$ | TIXL09 |
| RESISTORS | |
| $R_1$, $R_3$, $R_5-R_8$, $R_{14}$, $R_{15}$, $R_{43}$, $R_{44}$, $R_{47}-R_{50}$, $R_{59}-R_{61}$, $R_{66}$, $R_{78}$, $R_{79}$ | 200k |
| $R_9-R_{11}$, $R_{23}-R_{26}$, $R_{45}$, $R_{46}$, $R_{52}$, $R_{54}$ | 10k |
| $R_{12}$, $R_{13}$, $R_{55}$, $R_{56}$, $R_{75}$, $R_{82}$, $R_{83}$, $R_{85}$, $R_{86}$, $R_{88}-R_{91}$, $R_{93}-R_{97}$, $R_{202}$ | 100k |
| $R_2$, $R_4$ | 22k |
| $R_{16}-R_{18}$, $R_{51}$, $R_{53}$ | 4.7k |
| $R_{19}$, $R_{20}$, $R_{33}$, $R_{34}$, $R_{62}$, $R_{63}$, $R_{73}$, $R_{74}$ | 56k |
| $R_{21}$, $R_{22}$, $R_{27}$, $R_{29}$, $R_{31}$, $R_{32}$, $R_{64}$, $R_{65}$, $R_{67}$, $R_{69}$, $R_{71}$, $R_{72}$ | 220k |
| $R_{28}$, $R_{30}$, $R_{68}$, $R_{70}$ | 860k |
| $R_{35}$, $R_{38}$, $R_{57}$, $R_{58}$, $R_{205}$, $R_{206}$ | 180k |
| $R_{39}$, $R_{42}$, $R_{76}$, $R_{77}$, $R_{80}$, $R_{81}$ | 156k |
| $R_{203}$ | 470k |
| $R_{204}$, $R_{207}$ | 180 |
| $R_{209}$ | 330 |
| $R_{208}$ | 1.8k |
| $R_{84}$, $R_{87}$, $R_{92}$ | 25k linear pot. |

-continued

| | |
|---|---|
| $R_{201}$ | 10k linear pot. |
| CAPACITORS | |
| $C_1$–$C_3$, $C_{21}$, $C_{22}$ | 6.8pF |
| $C_4$, $C_5$, $C_{14}$–$C_{17}$, $C_{23}$–$C_{26}$, $C_{39}$–$C_{44}$ | 100pF |
| $C_6$, $C_7$, $C_{12}$, $C_{13}$, $C_{27}$, $C_{28}$, $C_{33}$, $C_{34}$ | .03MF |
| $C_8$–$C_{11}$, $C_{29}$–$C_{32}$ | .12MF |
| $C_{18}$, $C_{20}$, $C_{35}$, $C_{37}$ | .012MF |
| $C_{19}$, $C_{36}$, $C_{38}$ | .05MF |
| $C_{201}$ | 10MF |
| $C_{202}$ | 120MF |
| PHOTORESISTOR | |
| $PR_{201}$ | CL3AL (Clairex) |

Among the many advantages of the present invention is the ability to encode audio signals from at least three recording channels to a conventional two channel storage means, such as a dual track tape or stereo record, and then play back the record, for example, and hear the reproduced signals as they were at the program source. Prior art systems have coupled three or more recording channels to a dual track source, but at playback, there has been no way to only activate certain speakers to produce only the sound as it was received by the corresponding microphones at the program source.

The signal source of the present invention having three or more signals encoded in two is also compatible with and will playback through conventional monaural and two channel stereophonic speaker arrangements. Various modifications of the disclosed embodiments may also be employed while still utilizing the principles of the present invention. For example, while the reproduction or playback apparatus has particular applicability when a two channel signal source is used, additional playback channels may also be coupled to a three or more channel signal source, the speakers associated with each channel being activated by cues present in one or all of the three or more source signals.

Additionally, the reproduction apparatus of the present invention may be utilized when there are say, only two pickup microphones located at the program source spaced, for example, at the left and right side of the orchestra. The two signals A and B are then respectively identical to the audio signals in each of the recording channels coupled to these microphones. At the playback portion, the third playback channel coupled to a third loudspeaker centrally disposed between a first and second loudspeaker, contains the signal (A+B) as previously described. As before, the third loudspeaker can be only activated in accordance with the relationship existing between the signals A and B as outlined in FIG. 5. This third playback channel is thus a derived channel, and reproduces the sound that would have been received at a third microphone centrally disposed between the right and left pickup microphone had it been present.

Various other modifications may be made to the above described embodiments by one ordinarily skilled in the art without departing from the spirit and scope of the invention as defined by the appended claims.

What is claimed is:

1. For use in a multidirectional sound reproduction system for producing fully directional audio information from only two recorded or transmitted stereo signals A and B, each having encoded thereon components of at least two input audio signals, sound reproducing apparatus, comprising:
    first, second and third amplifiers connected to receive said A and B signals, at least said first amplifier being a gain controllable amplifier with separate audio and gain control inputs and receiving both of said A and B signals at said audio inputs, said second amplifier receiving at least said A signal, and said third amplifier receiving at least said B signal, said amplifiers being adapted to drive first, second and third loudspeakers, respectively, whereby said loudspeakers may be individually located to produce directional sound effects, and
    means for comparing said A and B signals and for generating at least one gain control signal representative of the similarity therebetween, the output of said means for comparing being connected only to the gain control input of at least said gain controllable first amplifier to control the amplification of its signals and, consequently, the audio output level of said first loudspeaker for such signals.

2. Apparatus as described in claim 1, wherein the means for comparing includes means for producing the absolute value of the waveforms of each of said A and B signals before comparison thereof.

3. Apparatus as described in claim 1, wherein said means for comparing includes means for obtaining the absolute value of the signal resulting from the comparison of said A and B signals.

4. Apparatus according to claim 1, wherein said control signal is supplied to at least said first gain controllable amplifier in a sense to decrease the output level of such one amplifier as the difference between said A and B signals increases.

5. Apparatus according to claim 1, wherein said second and third amplifiers are gain controllable and said control signal is supplied to said second and third gain controllable amplifiers in a sense to increase the output level of said second and third gain controllable amplifiers as the difference between said A and B signals increases.

6. For use in a multidirectional sound reproduction system for producing fully directional audio information from only two recorded or transmitted stereo signals A and B, each having encoded thereon components of at least two input audio signals, sound reproducing apparatus, comprising:
    first, second, third and fourth gain control amplifiers, each having separate audio and gain control inputs, at least a first of said amplifiers receiving the sum of said A and B signals at least a second of said amplifiers receiving the difference between said A and B signals, the third amplifier receiving at least the A signal, and the fourth amplifier receiving at least the B signal, said amplifiers being adapted to drive first, second, third and fourth loudspeakers, respectively, whereby said loudspeakers may be individually located to produce directional sound effects, and
    means for comparing said A and B signals and for generating at its outputs at least two gain control signals representative of the similarity therebetween, the outputs of said means for comparing being connected only to the gain control inputs of said gain controllable amplifiers to control the amplification of their signals and, consequently, the audio output level of the loudspeakers for such signals.

7. Apparatus as described in claim 6, wherein the means for comparing waveforms includes means for producing the absolute value of the waveforms of each of said A and B signals before comparison thereof.

8. Apparatus as described in claim 6, wherein said means for comparing includes means for obtaining the absolute value of the signal resulting from the comparison of said A and B waveforms.

9. Apparatus according to claim 6, wherein the gain of said first and second gain controllable amplifiers is controlled in a sense to decrease the output level of such first and second amplifiers as the difference between said A and B signals increases.

10. Apparatus according to claim 6, wherein the gain of said third and fourth gain controllable amplifiers is controlled in a sense to increase the output level of said third and fourth amplifiers as the difference between said A and B signals increases.

11. In a multidirectional sound reproduction system, a method of producing fully directional audio information from two recorded or transmitted stereo signals A and B which include components of input audio signals each having a directional characteristic, comprising deriving at least four audio output signals from said A and B signals, with each of said four audio output signals corresponding to a preselected direction and each input audio signal appearing dominant in the audio output signal corresponding to its directional characteristic while appearing attenuated in two other of said audio output signals, coupling said audio signals to respective variable gain amplifiers, comparing characteristics of the information transmitted on said A and B signals in a preselected manner, and varying the amplitudes of said four audio signals with respect to one another depending on said comparison in accordance with preselected criteria to increase the separation between said audio output signals and thereby enhance the directional effect of the reproduced audio output signals.

12. A method according to claim 11, including controlling the gain of two of said gain controllable amplifiers in a sense to decrease their output levels as the difference between said A and B signals increases.

13. A method according to claim 11, including controlling the gain of two of said gain controllable amplifiers in a sense to increase their output levels as the difference between said A and B signals increases.

14. A method according to claim 11 wherein said compared characteristics include the waveforms of the signals transmitted on said A and B channels.

15. A method according to claim 11 wherein said compared characteristics include the phases of the signals transmitted on said A and B channels.

16. A method according to claim 11 wherein said compared characteristics include the amplitudes of the signals transmitted on said A and B channels.

17. In a multidirectional sound reproduction system having two transmission paths wherein information regarding the location of an audio signal is transmitted by encoding components of such audio signal onto said paths, with said components having preselected amplitude and phase relationshps, and wherein a decoder having at least four outputs combines the two signals from said transmission paths in such a way that any one encoded audio signal has a temporarily predominant component at at least one decoder output corresponding to the temporary location of said audio signal and with cross talk components on others of said decoder outputs at relatively lower amplitudes, the improvement comprising:
    means for comparing the two signals from said transmission paths to determine the location of the temporarily predominant audio signal, and
    means responsive to said comparing means for effectively increasing the difference between the amplitude of said temporarily predominant component and the amplitudes of said cross talk components to thereby enhance the separation between the decoder outputs on which said predominant component and said cross talk components appear, the extent of enhancement being dependent upon said comparison means.

* * * * *